United States Patent [19]

Tellerman et al.

[11] Patent Number: 4,721,902
[45] Date of Patent: Jan. 26, 1988

[54] NOISE REJECTION IN A SONIC TRANSDUCER

[75] Inventors: Jacob Tellerman, Bayside; Carl A. Pedersen, Elmont; Boris Goldfeld, Rego Park, all of N.Y.

[73] Assignee: MTS Systems Corporation, Eden Prairie, Minn.

[21] Appl. No.: 752,715

[22] Filed: Jul. 8, 1985

[51] Int. Cl.$^4$ .................. G01R 27/04; H03K 5/22
[52] U.S. Cl. .................. 324/58.5 B; 307/234; 307/470
[58] Field of Search .............. 324/51, 52, 54, 58 B, 324/58.5 B; 179/175.3 F; 307/470, 234, 355, 356, 273, 516; 379/410

[56] References Cited

U.S. PATENT DOCUMENTS

| | | | |
|---|---|---|---|
| 3,189,849 | 4/1962 | Tellerman | 333/30 |
| 3,413,544 | 2/1966 | Jotten et al. | 368/121 |
| 3,898,555 | 8/1975 | Tellerman | 324/208 |
| 4,104,582 | 8/1978 | Lambertsen | 324/52 |
| 4,135,397 | 1/1979 | Krake | 324/58.5 B |

OTHER PUBLICATIONS

Acknowledged as prior art is the Series DCTL Precision Continuous Liquid Level Sensor of Temposonics Incorporated.
Acknowledged as prior art is the Series DCTR Non Contacting Potentiometer of Temposonics Incorporated.

Primary Examiner—Reinhard J. Eisenzopf
Assistant Examiner—Jack B. Harvey
Attorney, Agent, or Firm—Kinney & Lange

[57] ABSTRACT

A method of time domain noise rejection in a sonic transducer is disclosed in which all signal reception is prevented between application of a periodic electrical pulse and reception of the corresponding electrical signal. An inhibit signal, produced for a substantial portion of the time interval between application of an electrical pulse and reception of the corresponding electrical return signal, blocks all noise that may occur to provide a false indication of a return electrical signal during the time of the inhibit signal.

9 Claims, 10 Drawing Figures

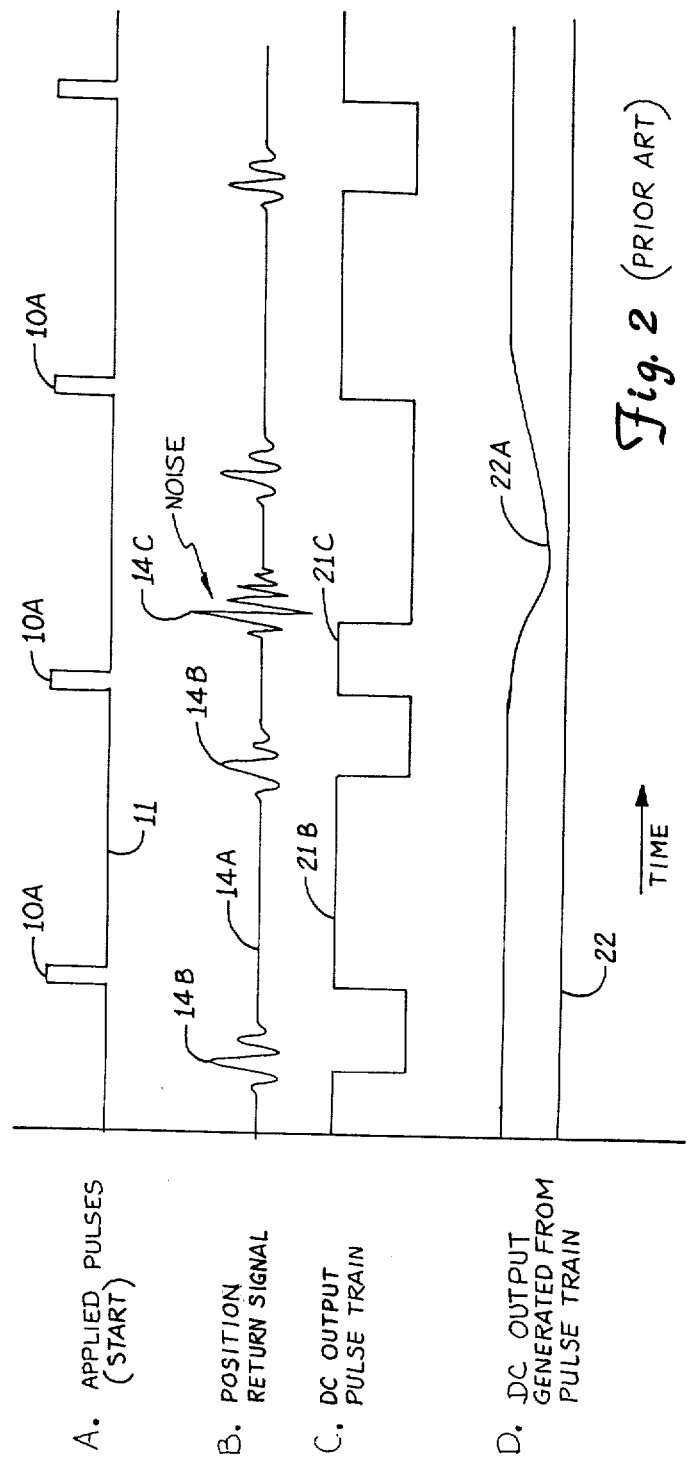

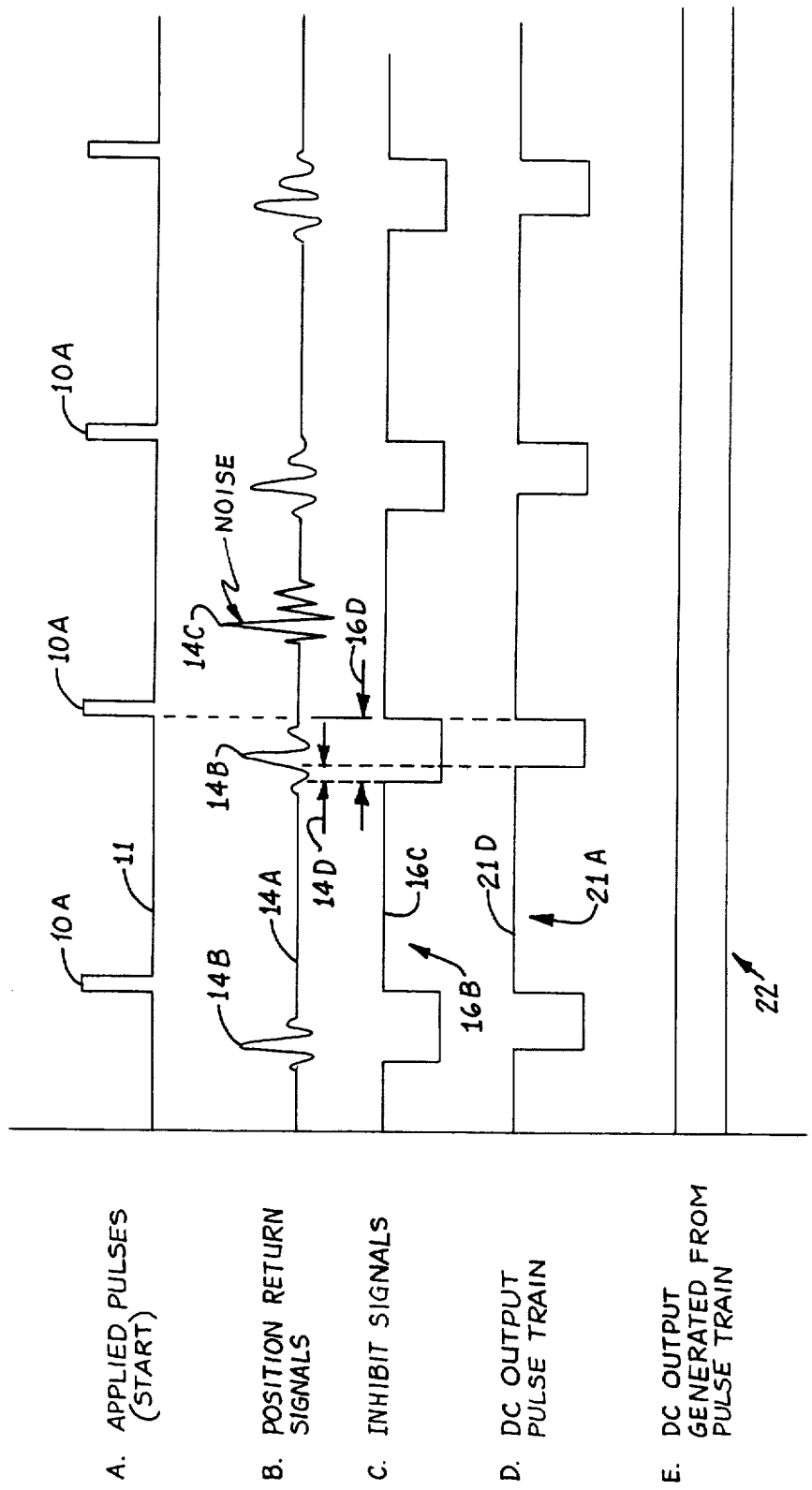

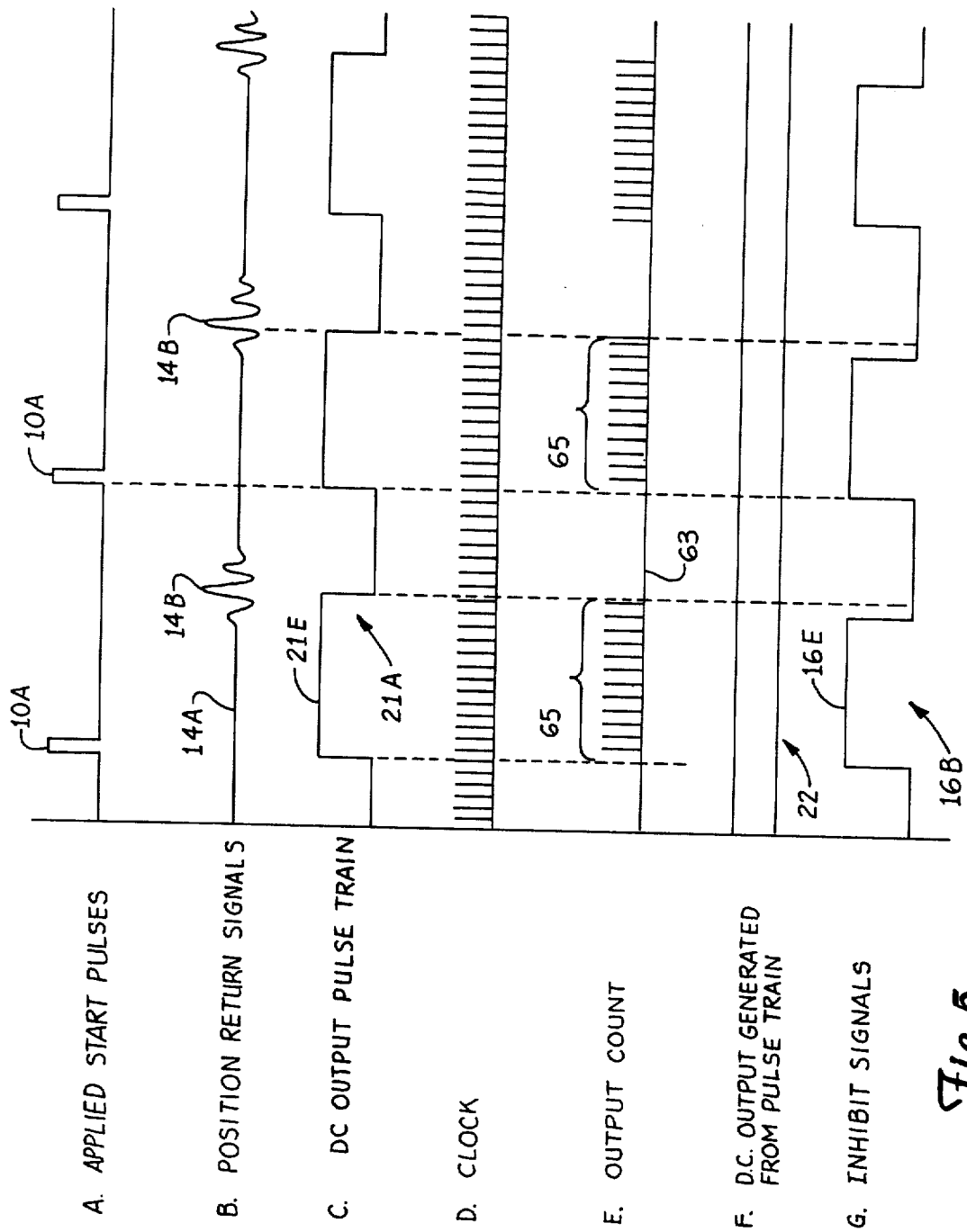

A. APPLIED START PULSES
B. FIRST POSITION RETURN SIGNAL
C. PULSE TRIGGERED BY FIRST RETURN SIGNAL
D. SECOND POSITION RETURN SIGNAL
E. PULSE GENERATED BY SECOND RETURN SIGNAL
F. THIRD POSITION RETURN SIGNAL
G. DC OUTPUT PULSE TRAIN
H. CLOCK
I. OUTPUT COUNT
J. DC OUTPUT GENERATED FROM PULSE TRAIN
K. INHIBIT SIGNALS

A. DC OUTPUT PULSE TRAIN
B. APPLIED START PULSE
C. LATCH PULSE
D. LOAD PULSE
E. COUNT UP RESET PULSE
F. INHIBIT SIGNALS

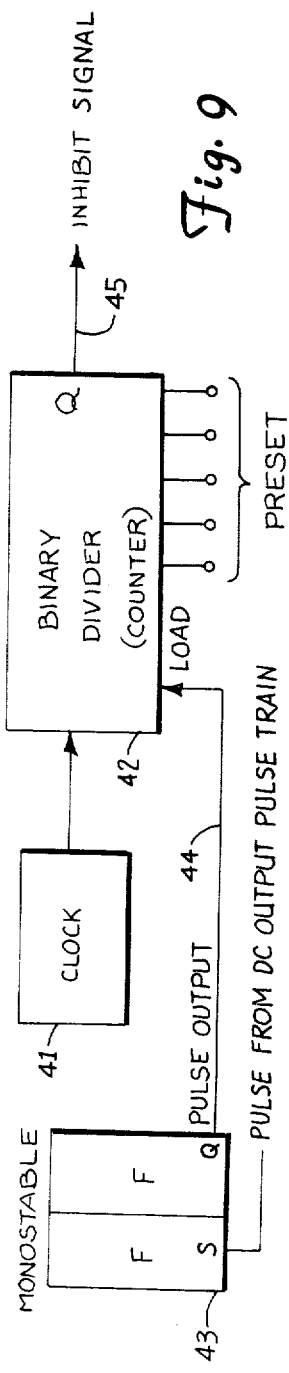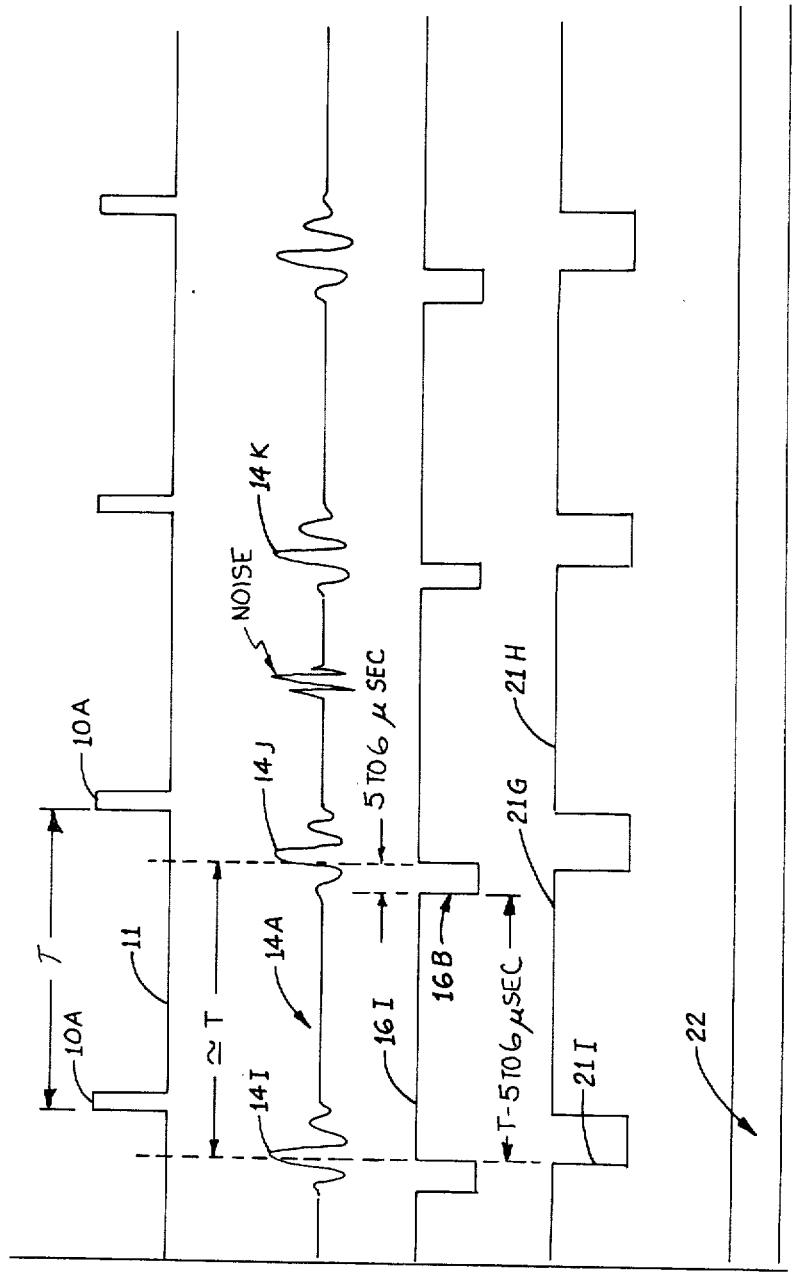

NOISE REJECTION IN A SONIC TRANSDUCER

BACKGROUND OF THE INVENTION

1. Field of the Invention.

The present invention relates to time domain noise rejection. In particular, the present invention relates to noise rejection in a sonic distance measuring transducer.

2. Description of the Prior Art.

Delay lines in sonic pulses have been utilized to measure distances. A linear distance measuring device employing a sonic transducer is disclosed in Tellerman U.S. Pat. No. 3,898,555. In this device, a mode converter is placed at one end of a ferromagnetic waveguide. A movable permanent magnet is mounted on the waveguide. Circuitry is provided for applying electrical pulses, from a pulse generator to a wire extending through the waveguide. When the magnetic field generated by the waveguide interacts with the magnetic field of the magnet, a sonic torsional pulse is launched for transmission along the waveguide. The sonic torsional pulse is sensed by the mode converter, which in turn generates an electrical return signal that is sensed and used to terminate a DC output pulse that is started at the time the pulse is applied to the wire and waveguide, is produced each pulse representing the interval between application of a pulse to the wire and reception of the corresponding electrical signal from the mode converter. The pulse train is averaged (filtered) to provide a DC voltage output proportional to the value of the pulse train which in turn is directly proportional to the position of the permanent magnet along the waveguide.

The present invention insures that the output pulses are ended only when the signal sensed is from the mode converter corresponding to the start pulse that initiated the DC output pulse. The frequency spectrum of the return signal is in the radio frequency band of industrial noise, such as that caused by switching contacts, solenoids, off-on transients of motors, etc. Such noise, induced either magnetically, capacitively or by radiant field, is picked up as a signal in the transducer. The noise on the return line may falsely terminate the DC output pulse thus inducing transient changes in the DC pulse train.

Conventional methods to prevent reception of noise have proved inadequate. Because the noise is in the same frequency band as the expected return signal, normal passive selective band pass filters are not effective. Attempts to raise the return signal level from the mode converter to improve the signal-to-noise ratio so that noise can be rejected have also proved unreliable because the amplitudes of mode converter return signal cannot be raised significantly higher than the noise amplitude using normal circuitry and manufacturable transducer parts.

SUMMARY OF THE INVENTION

The present invention teaches apparatus and a method for noise rejection where noise can be in the same frequency band as an expected return signal. Specifically, the apparatus and method is useful in a distance measuring sonic transducer where a start electrical pulse is applied to a transducer and a magnet positioned on the transducer causes a return signal which is received at a time subsequent to the start pulse proportional to the distance of the magnet from a reference. Noise rejection, and thus return selective signal reception, can be accomplished during any desired time domain related to the time of receipt of the return signal. An inhibit signal for preventing reception of return signals by the output DC pulse generator is applied to the output pulse generator, which as shown is a flip flop. The inhibit signal is started with the start pulse and is terminated slightly before the end of the time interval of the expected return signal from the mode converter. All signals are rejected by the output pulse generator while the inhibit signal is present.

In particular, an improved linear distance measuring device is disclosed. By applying the present method to a sonic transducer, noise reception is prevented, thus enhancing the reliability of measurement signals.

BRIEF DESCRIPTION OF THE DRAWINGS

FIG. 2 is a time base diagram of the sonic transducer operation of the prior art device, illustrating the effect of noise on such conventional signal processing circuitry;

FIG. 3 is a time based diagram illustrating operation of the circuit of the present invention as illustrated in FIG. 1;

FIG. 5 is a time based diagram illustrating the operation of the digital output circuit of FIG. 4;

FIG. 9 is a schematic representation of a modified digital circuit for obtaining an inhibit signal for noise rejection according to the present invention; and FIG. 10 is a time based diagram illustrating the operation of the circuit of FIG. 9.

DETAILED DESCRIPTION OF THE PREFERRED EMBODIMENTS

A sonic transducer as taught in Tellerman U.S. Pat. No. 3,898,555 applies electrical current pulses (applied start pulses) to a waveguide at repeating periods, and a movable magnet on the waveguide distorts the magnetic field generated by the current pulse in a wire carrying the pulse and causes a torsional pulse in the waveguide. The torsional pulse is sensed to generate a return electrical signal, and the time between launching the start current pulse and receipt of the return electrical signal is proportional to the position of the magnet along the waveguide. In this way distances can be accurately measured when the magnet is moved to the various positions along the waveguide in response to external actions.

Figure 1:
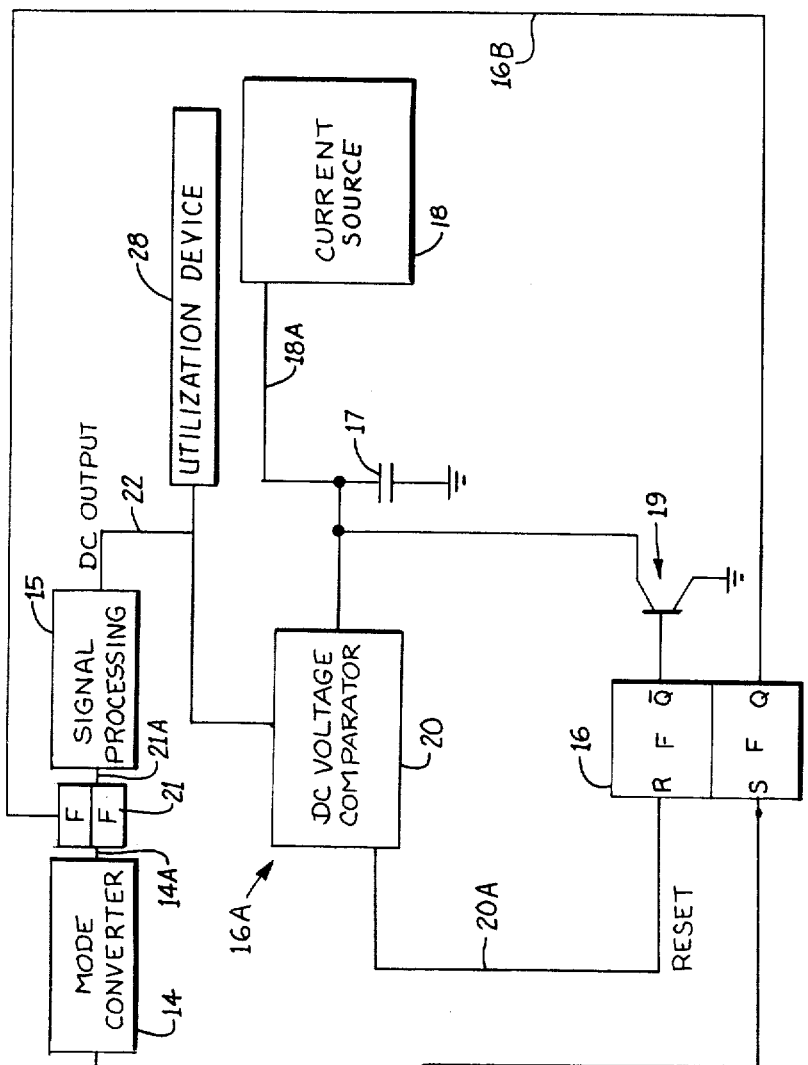
FIG. 1 is a schematic diagram of a sonic transducer of conventional design with one form of the noise rejection circuit of the present invention included in the circuitry.

FIG. 1 is a schematic circuit diagram of the linear distance measuring device including the improvements of the present invention. A first form of the time domain noise rejection circuit is incorporated into a sonic transducer and circuit shown in FIG. 5 of U.S. Pat. No. 3,898,555 and the description in U.S. Pat. No. 3,898,555 may be referred to for a detailed explanation of the sonic transducer and its operation. In operation electrical start pulses, or applied start pulses are generated by a pulse generator 10 that applies pulses 10A at set time intervals, comprising a time period T. The pulses 10A are transmitted in a circuit through wire 11 along a waveguide 13, which is made of a ferromagnetic material. The resultant magnetic field associated with the current in wire 11 is concentrated in waveguide 13. A movable magnet 12 is mounted on the waveguide 13 and its magnetic field distorts the circular magnetic field from the wire 11 and launches a torsional pulse in the waveguide in response to the electrical pulse. The movable magnet can be coupled to a member whose position is to be sensed.

A mode converter 14 (corresponding to mode converter 24 of U.S. Pat. No. 3,898,555), comprises a sensor that is affected by the torsional pulse in the waveguide, as explained in U.S. Pat. 3,898,555, and the mode converter 14 is constructed to emit a corresponding electrical current return signal that is provided on a line 14A to a flip flop 21 and then to a signal processing circuitry 15. The flip flop 21 comprises a pulse former or generator, which delivers a substantially constant amplitude DC voltage signal on an output line 21A until it is reset. When reset, the DC signal on line 21A comprises a DC pulse, and repetitive pulses are used to produce a DC output pulse train.

The signal processing circuit 15 is representative of that part of the processing circuitry of FIG. 5 of U.S. Pat. No. 3,898,555 on the output side of the switch 46, in that flip flop 21 provides a DC signal output when it is set. The signal processing circuit 15 receives the DC output pulses from the flip flop 21, on line 21A, and each of these pulses has a time related width that is equal to the time from each of the start pulses 10A, until the return signal of the mode converter 14 resets the flip flop 21. The signal processing circuitry 15 filters the DC output pulses on line 21A and provides a DC output voltage signal on line 22 that is used to power a utilization device 23, or to drive a meter or the like, to indicate the DC voltage level on line 22, which is proportional to the distance of the magnet 12 from a reference position as determined by the time between the start pulses and the corresponding return pulse.

The conventional circuitry shown in U.S. Pat. No. 3,898,555 is essentially that just described, except that the pulse generator 10 triggers or sets the flip flop receiving the output of the mode converter in the prior circuit, while in this case that has been changed. FIG. 2 is a time based schematic representation of the prior art circuit, similar to the representation in FIG. 6 of U.S. Pat. No. 3,898,555, but showing the effect of noise on the line 14A. Row A of FIG. 2 shows the applied start pulses 10A, having a period T therebetween, which are present on the wire 11. Row B shows the position return signals on line 14A, and these signals are shown at 14B. For example, the first start pulse 10A on row A is launched and the second return signal 14B in row B corresponds to or is the return for that start pulse 10A. Row C illustrates the DC output pulse train on line 21A, and as can be seen the pulse 21B is initiated at the start of pulse 10A, and is terminated when a return signal 14B from mode converter 14 is received by the flip flop 21.

In the conventinal circuit, the flip flop 21 was started by the pulse 10A from the pulse generator 10, to provide a DC signal through a switch, and when the current pulse from the mode converter 14 was received the flip flop was reset to cut off the DC pulse signal to provide the pulse train with pulses having a time duration proportional to the position of the magnet to provide a pulse train. The output pulse train on line 21 was filtered to provide an average DC voltage proportional to magnet position, in the circuit corresponding to processing circuit 15. This DC voltage output is present on line 22 in FIG. 1.

Row D shows the DC output voltage generated from filtering and averaging the pulse train of row C.

As can be seen in row C when a noise signal 14C of sufficient amplitude is on line 14A, it will act the same as a legitimate return signal 14B and will reset the flip flop 21 to terminate the DC output pulse prematurely, providing a false indication of magnet position and causing the short pulse shown at 21C. Since the pulses on line 21 are initiated by each one of the applied start pulses 10A, there will be no output DC signal for a substantial portion of one period T when noise is received as shown by signal 14C. This will cause a lower average DC signal on the output line, as shown generally at 22A, providing an erroneous output.

A typical circuit used for carrying out the present invention is shown generally at 16A in FIG. 1. The circuit 16A provides a set and inhibit pulse signal (called an inhibit signal) to the flip flop 21 to set the output of flip flop 21 high, that is at a substantially constant amplitude DC voltage, and keep it high regardless of signals on line 14A (which are to reset the flip flop), except during a "window" of time when the inhibit signal is removed, which is at a time when the position return signal on line 14A is expected. The length or time of the inhibit signal is based upon the timing for return of prior position return signals as indicated by the average DC voltage output signal on line 22. As shown, a flip flop 16 has its Q output (high signal when the flip flop 16 is set) connected to the set input of flip flop 21. The flip flop 21 output on line 21A cannot be reset or changed to a low signal during the time that the flip flop 16 is providing an output online 16B. The time that the inhibit signal is present on line 16B is a function of the DC output signal on line 22, so that the time width of the pulse on line 16B is a function of the previous times or widths of the pulses on line 21A. As shown, the time of the inhibit signal is controlled by comparing the DC output voltage on line 22 with a voltage on a line controlled by a timing capacitor arrangement that is charged at a set, known rate, so that the time delay before resetting the flip flop 16 is controlled. A stable current source 18 has an output line 18A connected to one plate of a capacitor 17, which has its other plate connected to ground. Line 18A is also connected to the collector of a transistor switch 19 that has its emitter connected to ground, and the base of transistor 19 is connected to the Q̄ output of the flip flop 16. Thus, when the flip flop 16 is reset the base of transistor is biased by a voltage to conduct and connect line 18A and the connected plate of capacitor 17 to ground through the emitter of the transistor 19.

As soon as the flip flop 16 is set by a pulse 10A from pulse generator 10, the signal on the output of flip flop 16 connected to the base of the transistor 19 goes low, and the transistor 19 no longer conducts, so that the capacitor 17 is then charged by the output on line 18A from the current source 18. The voltage on line 18A rises with time as the charging of capacitor 17 continues, and this voltage is sensed at one input of a comparator 20. The other input of the comparator 20 is connected to DC output voltage line 22. When the voltage on the line 18A equals (or exceeds) the DC output voltage on line 22, the comparator 20 provides a high output on line 20A to reset the flip flop 16. The inhibit signal is removed from line 16B, which goes low, and the transistor 19 is made to conduct to discharge capacitor 17 as soon as the flip flop is reset, thus preparing the capacitor 17 for a new cycle.

When the inhibit signal has disappeared from line 16B, the flip flop 21 is left in a state where an appropriate level signal from mode converter 14 on the line 14A will reset flip flop 21 to remove the high signal on line 21A, until a new pulse or signal is received on the line 16B to set the flip flop 21 and keep the output of flip flop 21 high for the time that this signal remains on line 16B, which is during the inhibit signal pulse width.

In FIG. 3, a timing diagram illustrates the operation of the time domain noise rejection method of the present invention. Rows A and B show the applied start pulses 10A from pulse generator 10 and the corresponding position return signals from the mode converter 14, respectively. Row C represents the set and inhibit pulse signals (inhibit signal) from the flip flop 16 on line 16B, which start upon initiation of a pulse 10A, setting flip flop 16, and which end sequentially when the comparator 20 provides an output. The inhibit pulse signal indicated at 16C in row C ends a short time before a position return signal 14B is expected from the mode converter 14. This time is represented by distance 14D adn it is the time between the trailing edge of the inhibit signal 16C and the positive going peak of signal 14B. When the positive going peak of position return signal 14B is above a set level it resets the flip flop 21 to cut off the high pulse on line 21A, which pulse is the DC output pulse represented at 21D. The trailing edge of pulse 21D comes after the inhibit signal 16B is removed. The window during which signals on line 14A can reset flip flop 21 is shown at 16D.

Any noise 14C on line 14A will not reset flip flop 21 and is preventing from affecting the pulse train 21C on row D, or the DC averaged output signal generated from the output pulse train shown on row E. For example, if the noise shown in row B of FIG. 3 occurs, it is during the time that the inhibit signal is high, and it will not reset the flip flop 21.

Figure 4:
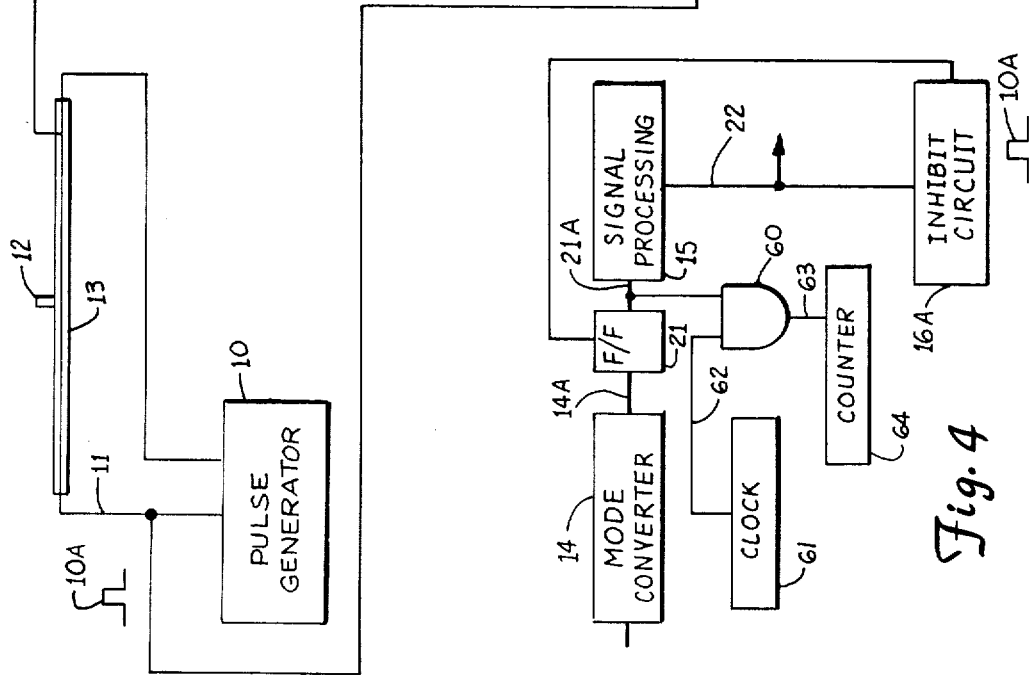
FIG. 4 is a schematic representation of an output circuitry used with the sonic transducer of FIG. 1 providing a digital output.

Digital outputs can be provided with the present invention, in a conventional manner, and the inhibit signal can be utilized for insuring that the digital count will be accurate. FIG. 4 is a simplified schematic circuit for providing a digital output. The DC pulse output from the flip flop 21 (flip flop 21 is a pulse former), on line 21A, which is provided to the signal processing circuit 15, and thus to the pluse inhibit signal circuit 16A, is also connected to one input of an AND gate 60, which has its other input connected to the output of a crystal clock 61 that is providing a count along the line 62. When the AND gate 60 has a high input from line 21A, due to the DC output pulse 21E (which shows the position of magnet 12) the count from clock 61 is provided on the output line 63 of the AND gate 60, to a counter 64. The inhibit signal can be provided along the line 16B, to inhibit changing the state of flip flop 21 to prevent the count from the AND gate 60 to be triggered at the wrong time from noise on the line 11. The pulse on line 16B is the inhibit signal which is a time width modulated pulse.

The time based diagram of FIG. 5 depicts the conditions existing using a digital count output. The applied start pulses are shown on row A at 10A, in a conventional manner, and the corresponding position return signals 14B that are on line 14A are depicted in row B. These return signals come from the mode converter 14. The DC output pulse train is shown in row C, and each of the pulses is width modulated in accordance with the time between the launching of the pulse 10A and the receiving of the signal 14B that corresponds to that particular pulse 10A. This represents the digital pulse train output on line 21A, and the DC output generated from the pulse train is represented in row F, and is the DC signal present on line 22 of FIG. 1.

The DC output pulses in the pulse train can be represented by a digital count used for digital to analog conversion, direct digital inputs to a computer, or displayed on the counter on line 63 as represented by the counts illustrated at 65 on row E. The clock signal from clock 61 of FIG. 4 is represented on row D, and the inhibit signal derived from flip flop 16 and represented on row G is used as before to insure an accurate digital count by preventing noise from triggering the flip flop 21 during the inhibit signal time interval. The inhibit time interval again is a function of the output DC signal.

Another implementation of the time domain noise rejection method involves extending or multiplying the pulse width of the DC output pulses from the flip flop 21 by a recirculation process. The circuit for implementing this involves the addition of a counter and a second pulse generator that are triggered by each position return signal. This is done in commercial versions of the transducer shown in U.S. Pat. No. 3,898,555 at the present time, to improve the count resolution using standard digital components. The noise rejection inhibit signal is generated in the same manner as in FIG. 1, based on the average DC output signal on line 22, to inhibit reception of noise between a applied start pulse and a corresponding return signal pulse.

Figure 6:
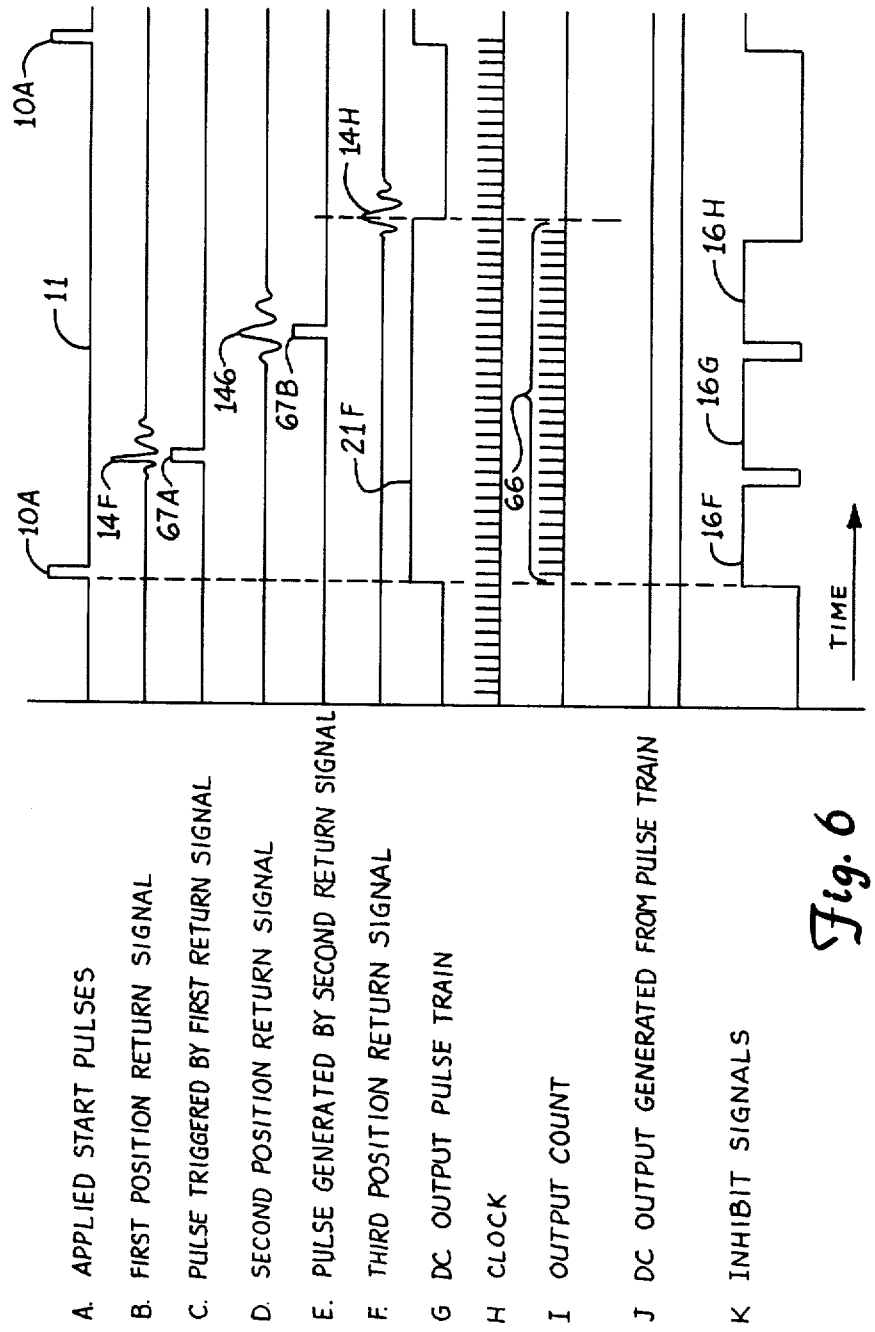
FIG. 6 is a time based schematic diagram illustrating a known technique for obtaining greater resolution of the digital output count and incorporating the noise rejection technique of the present invention.

The main pulse generator period is changed to be, for example, as shown in FIG. 6, three times the period used in the circuit of FIG. 1. This multiplication factor can be any desired amount and generally will be much higher than 3 which is used merely for illustrative purposes.

The secondary pulse generator and signal counter are coupled to the line 14A, and will independently generate a selected number of current pulses, as determined by the counter, in the wire 11 in response to the position return signals 14B, after which number as determined by the signal counter, the next pulse from the main pulse generator 10 is required to continue operation. The DC pulses providing the input to the signal processing circuit 15 will be of a time width that extends across the number of position return signals stored in the signal counter to provide a wide pulse signal of greater width to improve the resolution of the digital output representing pulse time with clocks in reasonable frequency ranges.

For example, where the signal time delay of the waveguide 13 is 9 usec/inch, which is normal, in order to obtain a digital output count resolution of 0.0001 inch using the count technique shown in FIGS. 4 and 5, a clock having a period of 0.0001 inch times 9 usec is needed. The period for the clock thus has to be 0.009 usec, or 1111 MHz, a very high frequency. Multiplying the width of the DC output pulse used for the output count, by receiving several position return signals during each such pulse generated as an output, the total count per pulse is increased and the resolution is enhanced with a lower frequency clock. If the basic output pulse is increased in width by 100 times, for example, the clock period is 0.0001×900 usec/inch or 0.09 usec which equals 11.1 MHz, a frequency reached with lower cost oscillators or clocks.

The time based graphic display of FIG. 6 illustrates the concept. In row A the applied pulses 10A are extended in time period, that is there is a greater time between the pulses 10A than normal. As shown, the period is three times as long as in FIG. 5. An output DC pulse 21F on output signal pulse line 21A is initiated, as shown in row F of FIG. 6, upon launching of the applied start pulse 10A. Pulses 21F in the output pulse train shown in row G of FIG. 6 are used to provide the average output DC voltage as before as shown on row J, FIG. 6. Also, a clock signal represented on row H is AND gated with the DC output pulse of row G to an output line as represented on row I, and generally as shown in FIG. 4. An inhibit signal also is commenced when pulse 10A is launched as shown on row K, and this inhibit signal indicated at 16F is used to inhibit false counts in the signal counter, in that flip flop 21 providing the output DC signal pulse shown at 21D will not be terminated or reset until a desired count of position return signals (as shown in FIG. 6 three return signals) have been received from mode converter 14. This count is kept in a counter as stated, and the counter will reset flip flop 21 when the predetermined count has been reached.

When a first position return signal indicated at 14F in row B is received, it triggers the counter (it is counted) and also triggers a second pulse generator that sends out a signal pulse 67A on line 11 (as represented on row C of FIG. 6) serving the same function as the pulse 10A. Also, the first inhibit signal pulse 16F, as determined by the circuit 16A or by subsequently described circuits, has been ended shortly before the signal 14F was returned, to insure rejection of noise until shortly before the expected return of signal 14F. The pulse 67A reinitiates the inhibit signal and causes the generation of an inhibit signal shown at 16G on row K. However, pulse 21F continues uninterrupted, because the flip flop 21 is not reset, and the counter represented on row I of FIG. 6 continues to count. The pulse 67A is then sensed by mode converter 14 which sends out a second position return signal 14G represented on row D. The second position return signal triggers the sending of a second pulse 67B on wire 11 as shown on row E, and also the signal counter that is used is tripped again to indicate another transmission of a pulse based upon a return signal.

The inhibit pulse 16G is terminated before return signal 14G is sent, and the inhibit pulse may be a function of the DC output generated from the pulse train. The steady DC signal is represented at row J. The pulse 67B initiates a new inhibit pulse 16H, and after pulse 67B is launched on the wire 11, it results in the mode converter 14 generating a third position return signal 14H as represented on row F of FIG. 6. The inhibit pulse 16H terminates before receipt of signal 14H, as controlled by the DC output indicated in row J of FIG. 6, and the circuit 16A. The signal 14H is the last position return signal to be received in the recirculation arrangement as shown, and the signal counter that counts the return signals will then indicate that the preset count has been reached, resetting the flip flop 21 to cut off output DC pulse 21D and the output count indicated on row I. After the recirculation count has been reached, no further signals are launched until the pulse generator 10 launches a new applied start pulse 10A. The recirculation can be for a 100 or so return signals from the mode converter 14 during the period of the pulse generator 10, to have a substantial width on pulse 21D and a long count on the output line 63. The count represented at 67 in FIG. 6 can be used as a direct digital input to processors or readout in a display of a counter.

While the arrangement shown in FIG. 6 increases the digital resolution by providing a larger count for each of the output pulses, it also increases the time of making the measurement as well.

Figure 7:
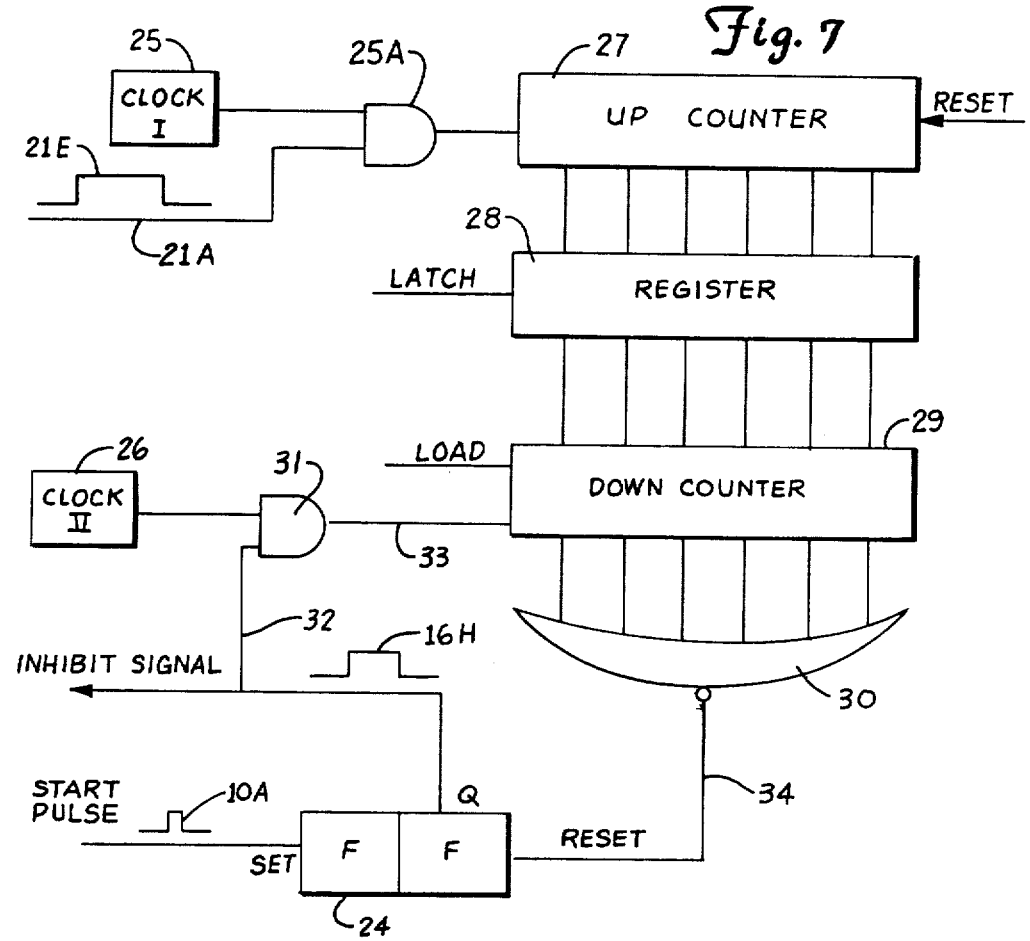
FIG. 7 is a schematic representation of a digital equivalent circuit for obtaining an inhibit signal for the noise rejection techniques of the present invention.
Figure 8:
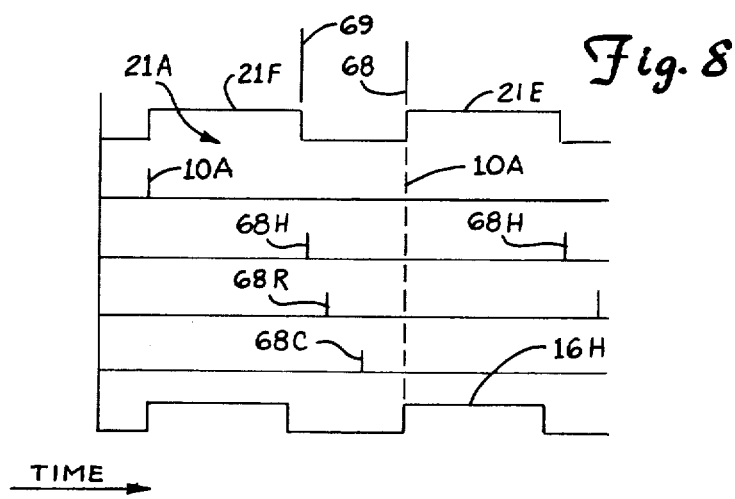
FIG. 8 is a time based diagram illustrating the operation of the circuit of FIG. 7.

The inhibit pulse utilized in the time domain noise rejection method can also be generated using digital techniques, an example of which is illustrated in FIGS. 7 and 8. The circuit 16A is replaced with the digital components of FIG. 7. To consider the operation, the sequence will be explained in relation to the second DC output pulse starting along the time indicated by dashed line 68 in FIG. 8 and shown in row A. This is the pulse that indicates magnet position. This sequence of course is repetitive, and occurs on a cyclical basis.

A start pulse 10A along line 68 from function generator 10 (row B of FIG. 8) activates flip flop 24 to start an inhibit pulse 16H and the pulse 10A also commences a DC output pulse 21E from flip flop 21 as shown in row A of FIG. 8. The pulse 21E is applied to an input of AND gate 25A as shown in FIG. 7 near to top. A first clock 25 has its output connected to the other AND gate 25A, and during the time the DC output pulse 21E is present a count of the clock pulses from clock 25 is made in counter 27. This count represents the width (time) of the pulse 21E, and pulse 21E is ended when a return signal is received from mode converter 14, as previously shown. Counter 27 had been reset, as will be explained, and when pulse 21E ends the count in the up counter 27 represents the time of the last DC output pulse from the flip flop 21.

A register 28 is coupled to the counter 27, and in the form shown, register 28 has been loaded with the count of the previous pulse 21F by a latch pulse 68A (the one to the left of line 68 in row C of FIG. 8) so that during the time counter 27 is counting time of pulse 21E, the register holds the previous count. The latch pulse 68A is trigered by the trailing edge of the DC output pulses of row A, FIG. 8, as shown along vertical line 69.

The number stored in the register 28 is transfered to a down counter upon receipt of a countdown load pulse shown at 68B on row D of FIG. 8 that is provided a set interval after the pulse 68A, and in the example being explained, the down counter 29 will have been loaded with a count representing the time of the DC output pulse 21F, that is, the one previous to the pulse 21E.

The commencement inhibit signal pulse 16H, as shown, provides a high signal to one input of an AND gate 31 along a line 32. The second input of the AND gate 31 is connected to a second clock, and the output line 33 of the AND gate will provide a count signal at the frequency of the clock 26 during the time that the inhibit signal 16H is present. This output from the AND gate 31 along line 33 provides the triggering of the down counter 29 to decrease the down counter with the application of the pulses from the clock 26. When the down counter reaches zero, a control signal is generated by a NOR gate 30, which is connected to the outputs of the counter 29, to provide a high signal along a reset line 34 to reset the flip flop 24 and shut off the inhibit signal 16H.

The frequency of the first clock 25 is selected to be lower than the frequency of the second clock 26 by a known, predetermined percentage, (the second clock has a shorter period) and the time to complete the down count can thus be set to be less than the time of the up count, for the same number of counts, to shut off the inhibit signal or pulse a selected time less that the time (width) of the last DC output pulse 21F. As shown in FIG. 8, the inhibit pulse 16H, which is used for controlling the flip flop 21, and is thus used to reject noise during the time of the pulse 16H, ends prior to the return signal from the mode selector 14 that terminates the pulse 21E.

It should be noted that prior to the time of the start of pulse 21E, along line 68 in FIG. 8, a count up reset pulse 68C has been provided, so the up counter 27 is ready to receive the count for the time of pulse 21E.

The entire system will repeat with a second pulse 68A being generated along the trailing edge of the pulse 21E, and the other pulses then will repeat in sequence.

The inhibit signal or pulse produced from the flip flop 24 is, in such manner, an accurate representation in time of the magnet position along the waveguide 13 as determined by the return signal that terminated the pulse 21F (prior tothe pulse 21E and inhibit signal 16H). In this way the inhibit signal can be directly dependent upon the previous DC output pulse in the pulse train shown in row A. FIG. 8, and by selecting the ratio of frequencies of the first and second clocks 25 and 26, respectively, the length of the inhibit pulse can be accurately controlled to accommodate shifting of the magnet for distance measurements in an active system.

In FIGS. 9 and 10, a further implementation of a digital technique for providing a inhibit signal having a time width selected time less than the basic period of the applied start pulses is shown.

The pulses on line A of FIG. 10 are the same as before and the period for these pulses 10A is shown as T. These pulses come from the function generator 10. The return signals received from the mode converter 14 are shown at 14I, 14J, and 14K by way of example. This is on row B of FIG. 10.

This results in DC output pulses shown at 21G, and 21H, respectively on row D of FIG. 10, which comprise a pulse train that is averaged as previously explained to provide a DC output voltage generated from the pulse train, and shown in row E of FIG. 10.

In this form, circuit 16A is replaced with the circuit shown in FIG. 9, and includes a monostable flip flop 43 that is triggered by the trailing edge of the DC output pulses. For example, the triggering could be along an edge shown at 21I in FIG. 10, row D, and the output from the flip flop 43 along line 44 is provided to binary divider (counter) that is presetable as to count on its output and also presetable as to the start of its count. When binary counter is triggered its output provides an inhibit or pulse on an output line 45, which corresponds to the lines that provides the inhibit signal in FIG. 1 to flip flop 21. The time of the output of the binary counter is determined by the preset count, which is equal to T, and by clock 41, which also determines the period T between pulses 10A for the pulse generator 10. However, the binary counter 42 will be preset so that the count output on line 45 can be started at a selected number, and completion of the count output, and thus the ending of the inhibit signal on line 45 can be a selected time less than the period T, which is the basic period for the pulses 10A. This period T will be substantially the same for the spacing between position return signals such as those shown at 14I and 14J. By reducing the time of the output signal on line 45 by five or six usec a window can be provided to insure that the signal 14I, 14J and 14K will be received and trigger flip flop 21 to its next state in that the inhibit signal indicated generally at 16I will be calculated to be enough less than the period T to accommodate for any motion of the magnet 12 between receipts of successive return signals from the mode converter 14. In practice this has been found to be about 5 or 6 usec, but the window could be wider if needed.

The preset count of the binary counter can be selected to accommodate the necessary window for ordinary operations. This then gives a very accurate inhibit signal to block out and reject any noise such as that shown between signals 14J and 14K in FIG. 10, row B, that can give erroneous results.

Deviations of magnet head or magnet motion between the pulses 10A, for the time period T generally will not exceed 2.5 usec even if it is assumed the the magnet moves as fast as 250 inches per second, and the period T is 1.1 miliseconds, such as needed for a compartively long 10 foot waveguide or transducer. By using the clock pulses from clock 41 that are used to generate the basic time period T for the applied pulses 10A and reducing this period by a preset number of counts in the binary divider 42, the inhibit signal such as that shown at 16I can be of duration equal to T, minus five or six usec, exactly the length of the inhibit signal desired.

In all forms of the invention the inhibit signal is provided to block out noise on the return line 14A from the mode convertor 14 for a period of time that is selected to give a "window" in which the true return signals from the mode convertor can be received to provided the proper pulse width indicating magnet position along for DC output pulses.

It should be noted of course that the DC output pulses are at a standard voltage level, and the average DC voltage output signal is a function of the width of the pulses, or the time of the pulses, in the DC output pulse train.

As has been shown, digital counts can be directly derived by measuring the width of the DC output pulses providing a count that is indicative of this width, and accuracy can be enhanced as outlined by having a recirculation technique where the DC output pulses have a width that represents a time for returning several signals from the mode convertor 14A.

Although the present invention has been described with reference to preferred embodiments, workers skilled in the art will recognize that changes may be made in form and detail without departing from the spirit and scope of the invention.

It will be noted that a noise signal induced between the time of the end of the inhibit signal and receipt of a position return signal will still present an early trigger ending the DC output pulse causing an error in that one cycle of the pulse team, but the error is only a very small increment of the correct width pulse. The small increment of possible error in the average DC output is tolerable for most control or servo systems with which the disclosed transducer is used.

What is claimed is:

1. A method of noise rejection in a circuit providing time information from the time of applying a first electrical pulse and which comprises the steps of:
   applying periodic first electrical pulses to the circuit at an origination time and originating a second electrical pulse at the same origination time;
   generating electrical signals in response to each first electrical pulse as a function of time of an occurrence;
   receiving the electrical signals and stopping each corresponding second electrical pulse when such electrical signal is received to result in a second electrical pulse time period;
   the second electrical pulse time period thereby indicating the time interval between application of each of the first electrical pulse and reception of the corresponding electrical signals;
   preventing reception of electrical signals during a substantial portion of the time interval between application of a first electrical pulse and reception of the corresponding electrical signals; and
   updating and varying the length of time that reception of electrical signals is prevented after each first electrical pulse is applied as a function of time periods of previous second electrical pulses.

2. A method as recited in claim 1 wherein the step for preventing reception of electrical signals is accomplished by providing an inhibit signal to prevent receiving any electrical signals during a time period substantially equal to the time period of the next previous second electrical pulse.

3. An improved linear distance measuring device of the type having means for applying periodic electrical pulses to a waveguide, means for receiving corresponding electrical signals generated in response to the electrical pulses which are provided to output signal reception means;
   circuit responsive means for measuring the time interval between the application of an lectrical pulse and the reception of a corresponding electrical signal, wherein the improvement comprises:
   means for preventing reception of electrical signals by the electrical signal receiving means during a substantial portion of the time interval between application of an electrical pulse and reception of the corresponding electrical signal; and
   means for varying the time that the means for preventing reception of electrical signals is effective as a direct function of the time interval between a series of previous pulses and the responsive electrical signals as provided by the circuit responsive means.

4. An improved linear distance measuring device as recited in claim 3 wherein the means for preventing reception of electrical signals comprises means for producing an inhibit signal and providing the inhibit signal to the electrical signal receiving means.

5. An improved linear distance measuring device as recited in claim 3 wherein the circuit responsive means comprises means to form a series of DC pulses each representing the time between the application of an electrical pulse and reception of a corresponding electrical signal, and means to provide a DC output signal which represents an average of the series of DC pulses.

6. An improved linear distance measuring device as recited in claim 5 wherein the means for producing the inhibit signal comprises:
   a current source,
   a capacitor,
   circuit means connecting the current source and capacitor for charging the capacitor to a voltage level upon reception of an initiated electrical pulse,
   means for comparing the DC output signal to the voltage charge on the capacitor and for producing an electrical signal when the voltage charge on the capacitor is equal or greater than the DC output signal,
   a transistor,
   a bistable flip flop,
   the current source, capacitor, transistor and flip flop having parameters selected so that an applied electrical pulse sets the flip flop, opening the transistor, and allowing charging of the capacitor,
   means for resetting the flip flop upon reception of the next applied pulse.

7. An apparatus for use in connection with a linear distance measuring device of the type having means for applying periodic electrical start pulses to a waveguide, means for receiving corresponding electrical return signals generated in response to the electrical pulses, means for providing DC output pulses proportional to the time from applying the periodic electrical pulses to receiving the corresponding electrical return signals, the improvement comprising:
   means responsive to a signal comprising a function of the time of prior DC output pulses, for providing an inhibit signal inhibiting the termination of each of the DC output pulses prior to a predetermined time subsequent to each periodic electrical start pulse applied.

8. The apparatus as specified in claim 7 wherein said means for providing an inhibit signal comprises digital counter means to provide a digital representation of the length of time of generation of a DC output pulse, and controlling a subsequent inhibit signal to a time substantially equal to that represented by the digital representation.

9. The apparatus as specified in claim 7 wherein said means to provide an inhibit signal includes means to control the length of time of the inhibit signal to a known time period less than the time between the periodic electrical start pulses applied to the waveguide.

* * * * *

UNITED STATES PATENT AND TRADEMARK OFFICE
CERTIFICATE OF CORRECTION

PATENT NO. : 4,721,902

DATED : January 26, 1988

INVENTOR(S) : Jacob Tellerman et al.

It is certified that error appears in the above-identified patent and that said Letters Patent is hereby corrected as shown below:

Column 11, line 16, delete "pulse" and insert --pulses--.

Column 11, line 41, delete "lectrical" and insert --electrical--.

Signed and Sealed this

Twenty-eighth Day of June, 1988

Attest:

DONALD J. QUIGG

Attesting Officer

Commissioner of Patents and Trademarks